Dec. 13, 1960 G. M. R. WINKLER 2,964,715
ATOMIC FREQUENCY STANDARD
Filed Feb. 5, 1959
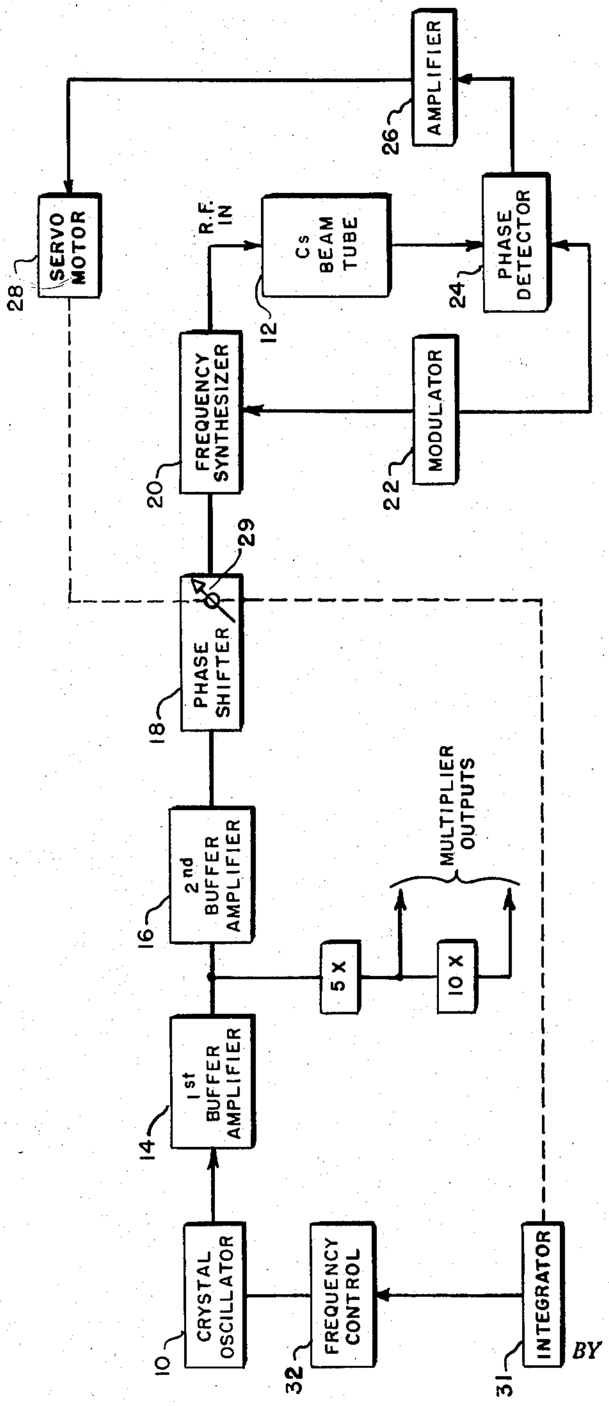
INVENTOR,
GERNOT M. R. WINKLER.
BY *Harry M. Saragovitz*
ATTORNEY.

2,964,715

ATOMIC FREQUENCY STANDARD

Gernot M. R. Winkler, Long Branch, N.J., assignor to the United States of America as represented by the Secretary of the Army Filed Feb. 5, 1959, Ser. No. 791,506

6 Claims. (Cl. 331—3)

(Granted under Title 35, U.S. Code (1952), sec. 266)

The invention described herein may be manufactured and used by or for the Government for governmental purposes, without the payment of any royalty thereon.

This invention relates to frequency stabilizing systems utilizing atomic frequency standards and more particularly to a frequency stabilizing system in which the unvarying resonance of the cesium atom is used as a standard to correct the frequency of a high precision crystal controlled oscillator.

It is well known that an atomic frequency standard employing a beam of cesium atoms, hereinafter referred to as the cesium beam tube, may be used to maintain the frequency stability of high precision crystal controlled oscillators. The cesium beam tube generates a highly stable and accurate frequency by continuously comparing the output of the crystal oscillator with the unvarying resonance of cesium atoms, hereinafter referred to as the transition frequency, and correcting the crystal oscillator frequency when the comparison indicates an error exists. In one such system, the crystal oscillator frequency is multiplied and synthesized to provide a signal at a frequency which is substantially equal to the cesium transition frequency. This signal is applied to the cesium beam tube from which information is derived about the exact value of the crystal frequency. When the information is such as to indicate that an error exists between the crystal oscillator frequency and the cesium beam transition frequency, an error signal is provided to return the crystal output frequency to its proper value by means of a servo motor. Under normal conditions, the error signal is usually due to the noise generated in the multiplier and synthesizer circuits and the instability of the servo system rather than the variation of the crystal itself. As a result, the crystal is being constantly retuned with concomitant deleterious affects to the short time stability of the crystal output frequency. This means that the short time stability of the crystal output frequency is much poorer than that of a free-running good crystal oscillator.

It is an object of the present invention to overcome such limitations.

It is another object of the present invention to provide a frequency standard for a crystal controlled oscillator such that the short time stability of the crystal is greatly improved.

In accordance with the present invention, there is provided a system wherein the frequency of a crystal controlled oscillator is stabilized by comparing its output with that of a frequency standard derived from an atomic or molecular resonance apparatus. Included is a cesium beam tube adapted to resonate at a prescribed transition frequency and means including a phase shifter responsive to the output of the oscillator whereby there is produced a synthesized frequency equal to the transition frequency and applied to the input of the cesium beam tube for comparison with the transition frequency. The phase shifter output is applied to the input of the synthesizer and including a rotatable phase shifting element adapted to be in its zero position only when the synthesized and transition frequencies are equal. Also included are means for deriving an error signal from the output of the cesium beam tube having a magnitude and sense which is a function of the difference between the transition and synthesized frequency. Further included are means characterized by a relatively short time-constant responsive to the error signal and in circuit with the phase shifter whereby relatively rapid variations in the synthesized frequency from the transition frequency are corrected by the output of the phase shifter until the error signal is reduced to a minimum, at which time the phase shifter returns to its normal zero output position. Included further are means characterized by a relatively long time-constant responsive to the output of the phase shifter and in circuit with the frequency determining crystal of the oscillator for controlling the output frequency of the crystal whereby any relatively slow variation of the synthesized frequency from the transition frequency caused by changes in the crystal output is corrected.

For a better understanding of the present invention together with other and further objects thereof, reference is had to the accompanying drawing which illustrates one embodiment of the present invention.

Referring now to the drawing, there is shown at 10 a crystal controlled oscillator whose output frequency is to be stabilized and at 12 there is shown an atomic or molecular resonance apparatus, as for instance, a cesium beam tube. As is well known, the unvarying resonance of the cesium atoms in such a cesium beam tube provides a frequency standard which is utilized as a reference frequency. The output of crystal oscillator 10 provides the basic source of radio-frequency energy for the cesium beam tube. As shown, the output of crystal oscillator 10 is applied to the RF input of the cesium beam tube through first and second buffer amplifiers 14 and 16, a motor driven phase shifter 18, and a frequency synthesizer 20. The synthesizer 20 comprises the usual frequency multipliers and harmonic and subharmonic generators, the outputs of which are combined to provide an RF signal at a frequency equal to that of the transition frequency of the cesium atoms in cesium beam tube 12. Motor driven phase shifter 18 is of conventional construction and no further description thereof is believed necessary. One such phase shifter may be of the inductance goniometer type described on page 137 of "Electronic Time Measurements," volume 20 of the MIT Radiation Laboratory Series (1949). Any other suitable rotary type transformer may also be used. The output of frequency synthesizer 20 is phase modulated at a relatively low frequency, 20 c.p.s. for example, by the output of modulation oscillator 22 and, as a result, the RF signal applied to the cesium beam tube 12 is phase modulated at 20 c.p.s. The output of cesium beam tube 12 is applied to a phase detector circuit 24 to which is also applied a reference signal from the output of modulation oscillator circuit 22. Since the RF signal applied to the cesium beam tube is phase modulated at 20 c.p.s., the output of the cesium beam tube 12 applied to detector 24 will also be a 20 c.p.s. signal. The magnitude and sense of the error derived from phase detector 24 will be a function of the difference between the RF applied signal from frequency synthesizer 20 and the frequency of cesium resonance or transition frequency. The error output from detector 24 is applied through amplifier 26 to a servo drive motor 28, the amplifier 26 being adapted to respond to error signals characterized by relatively short time-constants resulting from rapid changes in the error signal. As shown, the output shaft of servo motor 28 drives the tuning element 29 of phase shifter 18, the direction of rotation thereof being determined by the sense of the error signal derived from phase detector 24.

The mean or average position of the tuning element 29 is applied in the form of a correction signal to the crystal controlled oscillator 10 by means of a second servo loop which includes an integrating device 31 and a frequency control circuit 32. Although mechanical connections are shown between the integrator 31 and phase shifter 18, it is to be understood that the phase shifter may also apply an electrical signal to the integrator in any conventional manner. As an example, let it be assumed that the input frequency $f_{in}$ from crystal oscillator 10 is changed by the rate of change of phase $$\frac{d\phi}{df}$$

where $\phi$ is the phase increment due to the phase shifter. As a result the output frequency $f_o$ from phase shifter will then be $$f_o = f_{in} + \frac{d\phi}{df}$$

In other words, the speed of the phase shifter tuning element 29 is proportional to the frequency increment and the output of the phase shifter 18 is not equal to the input $f_{in}$ from crystal oscillator 10 but is changed by the rate of change of phase in accordance with the above noted formula. The integrator 31 may be a mechanical integrator of the ball-and-disk type shown on page 88 of "Electronic Instruments," volume 21 of the MIT Radiation Laboratory Series (1948). An electrical signal may also be derived by coupling a potentiometer to the tuning element 29 so that there is provided an output voltage proportional to shaft angle. Since this voltage will vary with time the integrator 31 may comprise an RC network or any other suitable electronic integrator. For either case, the integrating device 31 is characterized by a relatively long time-constant in comparison with the short time-constant response to the amplifier 26. For optimum operation, the ratio of the two time-constants should be at least 100 to 1. If the frequency output $f_o$ from phase shifter 18 is equal to the cesium resonance frequency, the tuning element 29 will remain in its zero position since no correction is required. If, on the other hand, the output of oscillator 10 is incorrect, the rotation of the tuning element 29 will apply a correction to track the cesium resonance frequency through the control loop comprising phase detector 24, amplifier 26 and servo motor 28, but the changing position of the tuning element 29 will produce a signal which is smoothed by integrator 31, the output of which will slowly correct the output of the crystal oscillator 10. As shown, the multiple output frequencies which are utilized as stabilized frequency sources are derived from the output of first buffer amplifier 14 as shown.

In operation, the relatively short time-constant loop including amplifier 26 and servo motor 28 is responsive to rapid changes of the error signal output from cesium beam tube 12 due to conventional noise, phase noise of the multiplier chains, etc. As a result, all such rapid changes are swiftly compensated for by the tuning of phase shifter 18 so that the error between the transition frequency of the cesium beam tube 12 and the input RF frequency applied thereto from frequency synthesizer 20 is returned to zero, and the tuning element 29 is returned to its original zero error position. If, however, there is an error signal due to the drift or ageing of the crystal utilized in crystal oscillator 10, then the tuning element will not be returned to zero error position but will be displaced therefrom. The average or amount of deviation of the mean position of the tuning element 29 from its zero error position is applied to the second servo loop including the integrator device 31. Due to the relatively long time-constant of the integrator device 31, the crystal oscillator is slowly corrected by means of frequency control circuit 32 until the error due to drift is compensated for. Thus, the second servo loop including the crystal oscillator is not affected by rapid fluctuations such as noise and, as a result, correction is applied to the control crystal of oscillator 10 only when drift is present.

While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A system for stabilizing the frequency of a crystal-controlled oscillator comprising a cesium beam tube adapted to resonate at a prescribed transition frequency, means including a phase shifter responsive to the output of said oscillator whereby there is produced a synthesized frequency equal to said transition frequency and applied to the input of said cesium beam tube for comparison with said transition frequency, said phase shifter output being applied to the input of said synthesizer and including a rotatable phase shifting element adapted to be in its zero position only when the synthesized and transition frequencies are equal, means for deriving an error signal from the output of said cesium beam tube having a magnitude and sense which is a function of the difference between said transition frequency and said synthesized frequency, means characterized by a relatively short time-constant responsive to said error signal and in circuit with said phase shifter whereby relatively rapid variations of the synthesized frequency from said transition frequency are corrected by the output of said phase shifter until the error signal is reduced to zero at which time the phase shifting element returns to its normal zero position, and means characterized by a relatively long time-constant responsive to the output of said phase shifting element and in circuit with the frequency determining crystal of said oscillator for controlling the output frequency of the crystal whereby any relatively slow variation of the synthesized frequency from the transition frequency caused by changes in the crystal output is corrected.

2. A system for stabilizing the frequency of a crystal-controlled oscillator comprising a cesium beam tube adapted to resonate at a prescribed transition frequency, means including a phase shifter responsive to the output of said oscillator whereby there is produced a synthesized frequency equal to said transition frequency and applied to the input of said cesium beam tube for comparison with said transition frequency, said phase shifter output being applied to the input of the synthesizer and including a rotatable phase shifting element adapted to be in its zero position only when the synthesized and transition frequencies are equal, means for deriving an error signal from the output of said cesium beam tube having a magnitude and sense which is a function of the difference between said transition frequency and said synthesized frequency, a first servo loop characterized by a relatively short time-constant having its output in circuit with said phase shifting element and its input responsive to said error signal, whereby relatively rapid variations of the synthesized frequency from said transition frequency are corrected by the output of said phase shifter until said error signal returns to zero, and a second servo loop characterized by a relatively long time-constant responsive to the output of said phase shifting element and having its output in circuit with the frequency determining crystal of said oscillator for controlling the output frequency of said crystal whereby any relatively slow variation of the synthesized frequency from the transition frequency caused by changes in the crystal output is corrected.

3. A system for stabilizing the frequency of a crystal-controlled oscillator comprising a cesium beam tube adapted to resonate a prescribed transition frequency, a frequency synthesizer having its output applied to said cesium beam tube for comparison with said transition frequency, a phase shifter including a rotatable phase shifting element, said phase shifter being responsive to the output of said crystal oscillator and having its output in circuit with said frequency synthesizer whereby when said crystal oscillator is at the desired frequency such that the frequency synthesizer output is at said transition frequency, said phase shifting element is in its normal zero position, means for deriving an error signal from the output of said cesium beam tube having a magnitude and sense which is a function of the difference between said transition frequency and said synthesized frequency, a first servo loop characterized by a relatively short time-constant having its output in circuit with said phase shifting element and its input responsive to said error signal, whereby relatively rapid variations of the synthesized frequency from said transition frequency are corrected by the output of said phase shifter until said error signal is returned to zero at which time the phase shifting element returns to its normal zero position, and a second servo loop characterized by a relatively long time-constant responsive to the output of said phase shifting element and having its output in circuit with the frequency determining crystal of said oscillator whereby any relatively slow variation of the synthesized frequency from its transition frequency caused by changes in the crystal output is corrected.

4. The system in accordance with claim 3 wherein said error signal deriving means comprises, means for phase modulating said synthesized frequency at a relatively low frequency, and a phase detector responsive to the said modulation frequency and the output of said cesium beam tube, said error signal being derived from the output of said phase detector.

5. The system in accordance with claim 3 wherein the ratio of the two time-constants is at least 100 to 1.

6. In a system wherein the frequency of a crystal controlled oscillator is standardized by comparing the transition frequency of a cesium beam tube with a synthesized frequency derived from said oscillator and including means for deriving an error signal from said cesium beam tube when the synthesized frequency differs from said transition frequency, means for discriminately compensating for relatively rapid variations and relatively slow variations in said error signals, said means comprising: a phase shifter interconnecting the output of said crystal oscillator and the frequency synthesizer and including a rotatable phase shifting element adapted to be in its zero position only when the synthesized and transition frequencies are equal, a first servo loop characterized by a short time-constant having its output in circuit with said phase shifting element and its input responsive to said error signals, and a second servo loop characterized by a relatively long time-constant responsive to the output of said phase shifting element and having its output in circuit with the frequency determining crystal of said oscillator.

References Cited in the file of this patent

UNITED STATES PATENTS 2,811,644 Norton --------------- Oct. 29, 1957

OTHER REFERENCES

Atomichron in Radio and Television News, January 1957, pages 63 and 120.